United States Patent
Sonntag et al.

(10) Patent No.: US 9,531,376 B2
(45) Date of Patent: Dec. 27, 2016

(54) SOLID STATE RELAY USING CAPACITIVE ISOLATION

(71) Applicant: Silicon Laboratories Inc., Austin, TX (US)

(72) Inventors: Jeffrey L. Sonntag, Austin, TX (US); Timothy J. Dupuis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/725,558

(22) Filed: May 29, 2015

(65) Prior Publication Data

US 2016/0352328 A1    Dec. 1, 2016

(51) Int. Cl.
*H03K 17/687* (2006.01)
*H02M 3/07* (2006.01)

(52) U.S. Cl.
CPC ............. *H03K 17/687* (2013.01); *H02M 3/07* (2013.01)

(58) Field of Classification Search
USPC ........................................................ 327/427
See application file for complete search history.

(56) References Cited

U.S. PATENT DOCUMENTS

| | | | |
|---|---|---|---|
| 5,894,215 A | 4/1999 | Yazdy et al. | |
| 6,262,600 B1 | 7/2001 | Haigh et al. | |
| 6,294,948 B1* | 9/2001 | Blodgett | H02M 3/073 327/536 |
| 6,525,566 B2 | 2/2003 | Haigh et al. | |
| 6,873,065 B2* | 3/2005 | Haigh | H01L 23/5222 257/531 |
| 6,903,578 B2 | 6/2005 | Haigh et al. | |
| 6,922,080 B2 | 7/2005 | Haigh et al. | |
| 7,493,505 B2 | 2/2009 | Leung | |
| 7,598,716 B2 | 10/2009 | Schlueter et al. | |
| 8,861,229 B2 | 10/2014 | Alfano et al. | |
| 2005/0269657 A1 | 12/2005 | Dupuis | |
| 2005/0271147 A1 | 12/2005 | Dupuis | |

(Continued)

FOREIGN PATENT DOCUMENTS

WO    2005122423 A2    12/2005

OTHER PUBLICATIONS

Agilent (Hewlett-Packard), "2.0 Amp Output Current IGBT Gate Drive Optocoupler," HCPL-3120 Technical Data Sheet, <http://www.datasheetcatalog.com>, pp. 1-182-1-196, (prior to May 29, 2008).

(Continued)

*Primary Examiner* — Lincoln Donovan
*Assistant Examiner* — Patrick Chen
(74) *Attorney, Agent, or Firm* — Zagorin Cave LLP

(57) ABSTRACT

An oscillator supplies a clock signal having a frequency determined in part according to a received current. A transmit side charge pump is coupled to the clock signal and boosts a voltage supplied to the charge pump to generate a boosted voltage. A driver circuit drives a transmit signal having a frequency based on the clock signal and a voltage based on the boosted voltage to a capacitive isolation communication path. A receive side charge pump is coupled to the isolation capacitors of the isolation communication path and boosts a voltage of the received signal on the receive side of the isolation communication path and supplies a gate signal with the boosted voltage to a gate of at least one transistor.

22 Claims, 9 Drawing Sheets

(56) References Cited

U.S. PATENT DOCUMENTS

| | | |
|---|---|---|
| 2005/0271148 A1 | 12/2005 | Dupuis |
| 2005/0271149 A1 | 12/2005 | Dupuis |
| 2005/0272378 A1 | 12/2005 | Dupuis |
| 2007/0040579 A1 | 2/2007 | Jang |
| 2007/0126372 A1 | 6/2007 | Huang et al. |
| 2008/0315925 A1* | 12/2008 | Alfano ................ H03K 17/691 327/103 |
| 2009/0206960 A1* | 8/2009 | Ng .......................... H01L 23/48 333/247 |

OTHER PUBLICATIONS

Toshiba, "TLP250(INV)," Toshiba Photocoupler, GaAlAs IRED & Photo-IC Data Sheet, <http://www.datasheetcatalog.com>, pp. 1-6, Jun. 27, 2002.

* cited by examiner

SOLID STATE RELAY USING CAPACITIVE ISOLATION

BACKGROUND

Field of the Invention

The invention relates to solid state relays and more particularly to use of isolation channels for implementing for solid state relays.

Description of the Related Art

Solid state relays (SSRs) have been used in place of mechanical relays in many applications. Traditionally, solid state relays have used optical isolation to transmit across the isolation barrier. FIG. 1 illustrates a traditional optical based solid state relay 101. There is no power supply available either on the transmit side or the receive side in the solid state relay 101. Instead, the solid state relay 101 receives a current 102 that turns on the light emitting diode 103. The emitted light turns on photodiodes 105, which turn on a field effect transistor (FET) 107. Thus, the current 102 controls the operation of the FET 107. When the current 102 is on, the FET 107 is on and when the current is off, the FET is off. Typically the FET 107 is located on the die with the photodiodes due to the low power available to drive the FET. Opto-based solid state relays, such as the one illustrated in FIG. 1, transmit low power due to the inefficiencies of the optical components and have high range of temperature variability. Such opto-based SSRs also tend to have slow turn on time (e.g., >1 ms) depending on the size of FET 107 as a larger FET would turn on more slowly given the same transmit power across the isolation channel.

SUMMARY OF EMBODIMENTS OF THE INVENTION

It would be desirable to transmit more power across an isolation barrier to provide faster startup time and to provide the ability to drive larger gate loads than traditional opto-based approaches.

Accordingly, in one embodiment an apparatus includes an apparatus comprising a first die and a second die coupled to the first die through a capacitive isolation communication channel. The first die includes an oscillator to supply a clock signal, a transmit side charge pump coupled to the clock signal to generate a boosted voltage, and a driver circuit coupled to the clock signal and coupled to the charge pump to drive a transmit signal indicating an on state to a capacitive isolation communication channel. The transmit signal has a frequency based on the clock signal and a voltage based on the boosted voltage. The driver signal drives no signal in response an off state. The second die includes a charge pump coupled to isolation capacitors of the capacitive isolation communication channel to boost a voltage based on a voltage of the transmit signal as received on a receive side of the capacitive isolation communication channel, and to supply a gate voltage signal based on the boosted voltage to a gate of a transistor.

In another embodiment a method includes receiving an indication of an on state and an off state to control a transistor across a capacitive isolation communication channel. An oscillator supplies a clock signal. A transmit side charge pump coupled to the clock signal generates a boosted voltage. A transmit signal is supplied to the capacitive isolation communication channel to indicate the on state, the transmit signal having a frequency based on the clock signal and a voltage based on the boosted voltage. Responsive to the off state, no transmit signal is supplied. The transmitted signal is received at a receive side of the capacitive isolation communication channel. A voltage based on the received transmit signal is boosted in a receive side charge pump coupled to isolation capacitors of the capacitive isolation communication channel and the charge pump supplies a boosted voltage. A gate signal based on the boosted voltage is supplied to a gate of the transistor to thereby control the transistor.

In another embodiment an apparatus includes an oscillator to supply a clock signal having a frequency determined in part according to a current indicative of an on state, such that an increase in the current results in an increase in the frequency and a decrease in the current results in a decrease in the frequency. A transmit side charge pump is coupled to the clock signal and boosts a voltage supplied to the charge pump to generate a boosted voltage. A driver circuit is coupled to the clock signal and to the charge pump to drive a transmit signal having a frequency based on the clock signal and a voltage based on the boosted voltage to an isolation communication path including isolation capacitors. A receive side charge pump is coupled to the isolation capacitors to boost a voltage present in a received signal corresponding to the transmit signal and to supply a gate signal based on the boosted voltage to a gate of at least one transistor.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
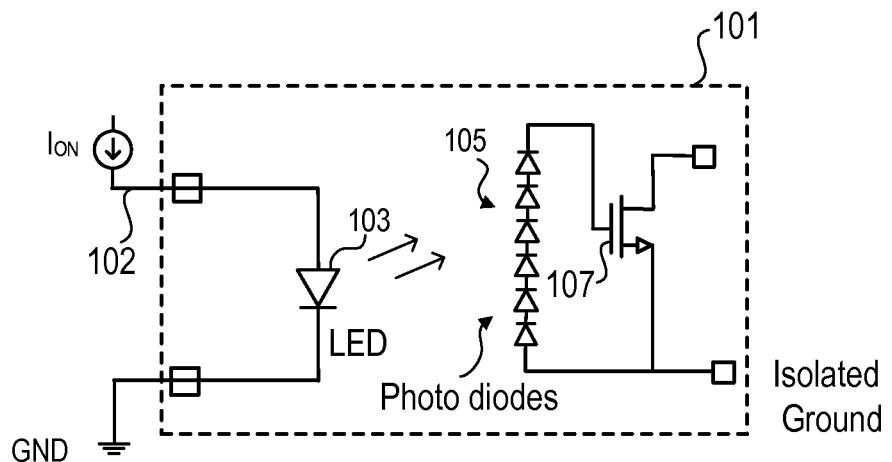
FIG. 1 illustrates a prior art opto-based relay.
Figure 2A:
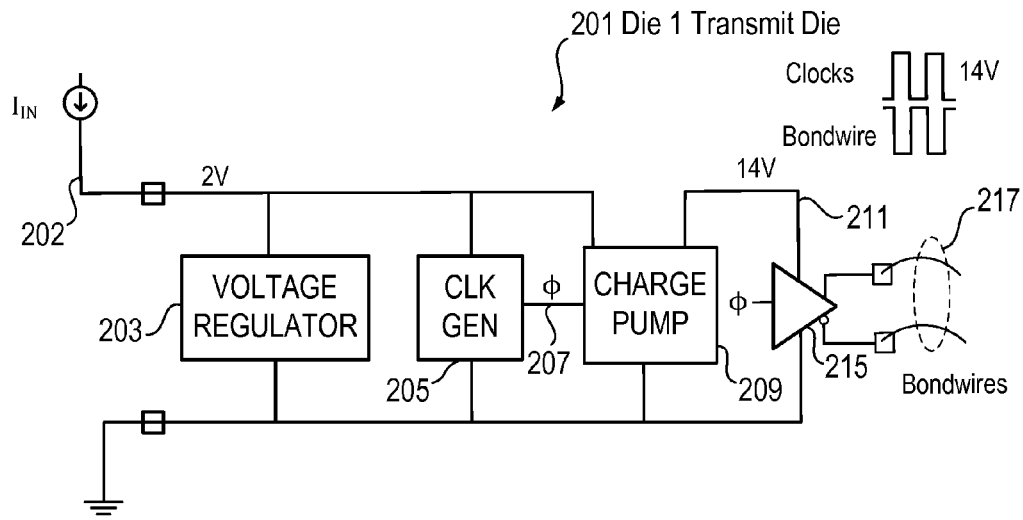
FIG. 2A illustrates a transmit side circuit according to an embodiment.

FIG. 2A illustrates an example of transmit side circuit for use in an embodiment of a solid state relay circuit. The transmit side circuit 201 receives an input current 202 similar to the input current 102 (FIG. 1). The presence of the input current indicates an ON state and the absence of the input current indicates an OFF state. A voltage regulator 203 generates a supply voltage using the input current. The shunt regulator maintains the supply voltage at 2V and shunts additional current to ground. The supply voltage is used by the other components in the transmit side circuit. In the embodiment of FIG. 2A, a clock generator 205 generates a clock signal $\phi$ 207 used by a charge pump 209 to create a boosted voltage. The charge pump increases the supply voltage, e.g., from 2V to 14V. A driver circuit 215 receives the boosted voltage 211 as a supply voltage and transmits a differential signal based on the clock signal $\phi$ to bond wires 217. In the embodiment illustrated in FIG. 2A, the clock generator supplies a fixed frequency clock signal.

Figure 2B:
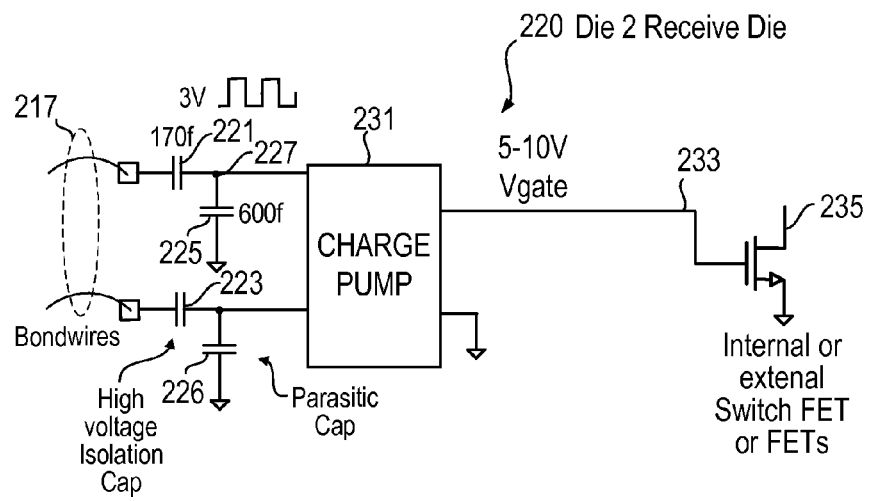
FIG. 2B illustrates a receive side circuit according to an embodiment.

Referring to FIG. 2B, the bond wires 217 are coupled to isolation capacitors 221 and 223 on the receive side circuit 220. The receive side includes a large parasitic capacitance 225 and 226 that significantly reduces the voltage of the received signal. For example, the voltage received may be reduced from the 14V signal transmitted from the transmit side 201 to 3V at node 227. If the voltage were not boosted by charge pump 209 (FIG. 2A) the voltage available at the receive side would be significantly smaller making the signal more susceptible to various forms of noise and interference. In addition, if the voltage was not boosted, the receive voltage could be too small for a CMOS charge pump to operate.

The received voltage signal is supplied to charge pump 231, which boosts the received signal to a higher voltage, e.g., 5-10V for use as a gate drive signal 233 for FET 235. Note that FET 235 can be internal or external to the receive side. The FET is turned on responsive to the ON state and turned off response to the OFF state. In some applications, an external FET is preferred because of low cost and greater flexibility for different FET applications, e.g., high voltage, low voltage, high current, low current, etc. In other applications, a FET located on the receive side die may be preferred.

One advantage of the embodiment shown in FIGS. 2A and 2B over opto-isolator implementations is that the illustrated embodiment can transfer more power across the barrier as compared to opto-based approaches. That allows charge times to be up to ten times faster than the opto-based approaches resulting in faster turn-on times as measured from the time current 202 starts until the FET 235 turns on. In addition, using capacitive isolation provides less temperature dependence as compared to opto-based approaches.

Figure 3:
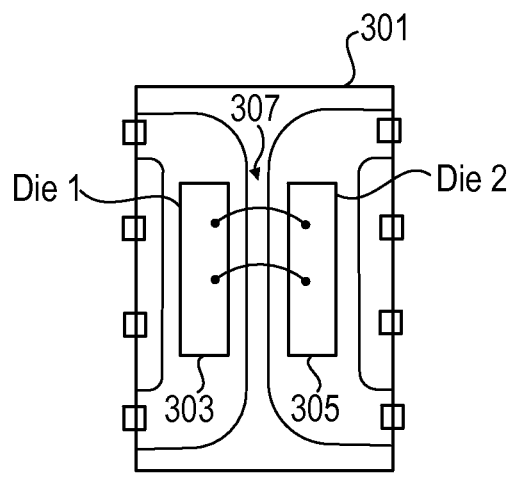
FIG. 3 illustrates an example of a package containing a transmit side die and a receive side die.

FIG. 3 illustrates an embodiment in which an 8 pin package 301 houses a transmit side die 303, such as illustrated in FIG. 2A, and a receive side die 305, such as illustrated in FIG. 2B. The transmit side die 303 and the receive side die 305 are coupled by bond wires 307.

Figure 4A:
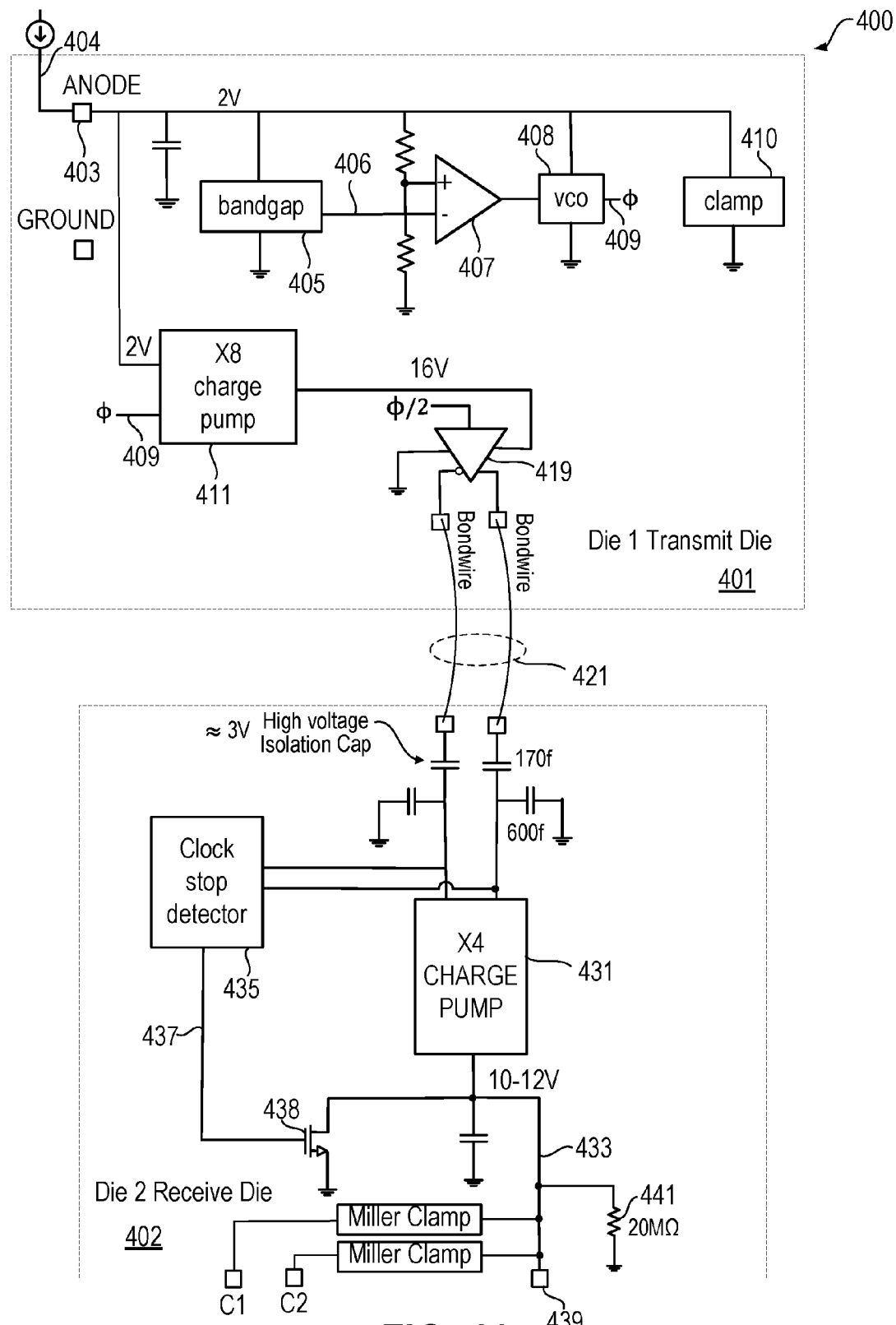
FIG. 4A illustrates additional details of an embodiment using capacitive isolation.

FIG. 4A illustrates additional details of an embodiment of a solid state relay circuit 400 implemented using capacitive isolation. The solid state relay 400 includes the transmit die 401 and the receive die 402. The anode 403 receives a current 404 indicative of an ON state that can vary, e.g., from 1 to 15 mA. The absence of the current 404 corresponds to the OFF state. A voltage is created from the received current 404 that is regulated to 2V. A bandgap circuit 405 supplies a reference voltage 406 to operational amplifier 407. The operational amplifier supplies voltage controlled oscillator (VCO) 408 with a control signal. As the current received on node 403 increases, the voltage across the voltage divider supplying the positive input of the operational amplifier 407 increases leading to the control signal to the VCO increasing. That causes the VCO to generate a clock signal 409 with a higher frequency. Conversely, a lower current causes the frequency of the clock signal supplied by the VCO to decrease. Thus, the frequency of the clock signal varies with the input current. In an embodiment the VCO is implemented as a ring oscillator but other oscillators may also be used. The capacitor coupled to the anode on the transmit die charges up to 2V to generate the supply voltage for the VCO.

The clock signal drives a charge pump 411. The charge pump operates in accordance with $I=C\times V\times f$, where C is capacitance utilized in the charge pump, V is the voltage, and f is the frequency of the clock signal $\phi$ 409. Thus, as frequency of the clock signal $\phi$ increases, the current I consumed by the charge pump, which is supplied from the anode, also increases. Note that some of the increase in current is also consumed by the voltage divider and the VCO but the charge pump dominates the use of increased current. Thus, the combination of the oscillator frequency increasing with increased input current and the increased frequency affecting current consumption of the charge pump serves to regulate the supply voltage to, e.g., 2V. With an increased clock frequency, the signal driven across the isolation barrier also has a higher frequency resulting in more power to be delivered across the capacitive isolation barrier.

Figure 4B:
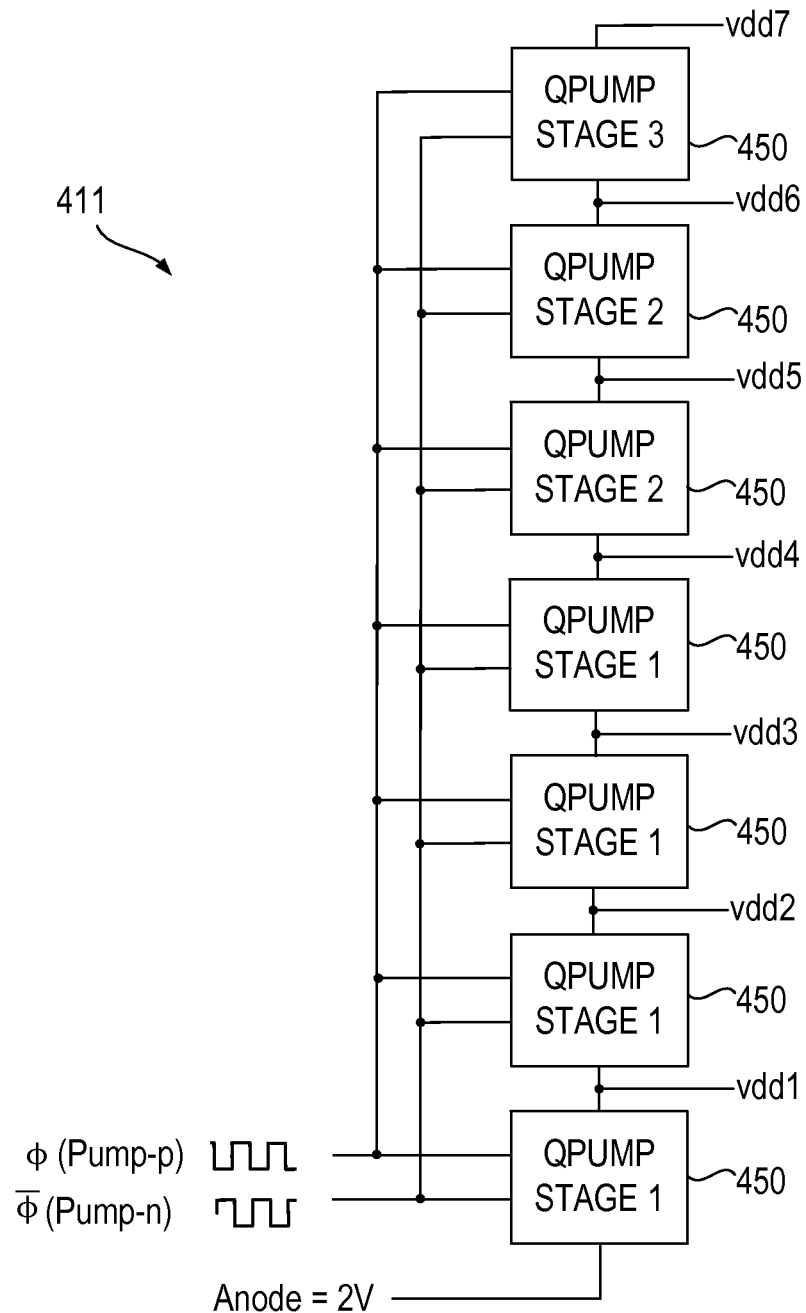
FIG. 4B illustrates additional details of an embodiment of the charge pump.
Figure 4C:
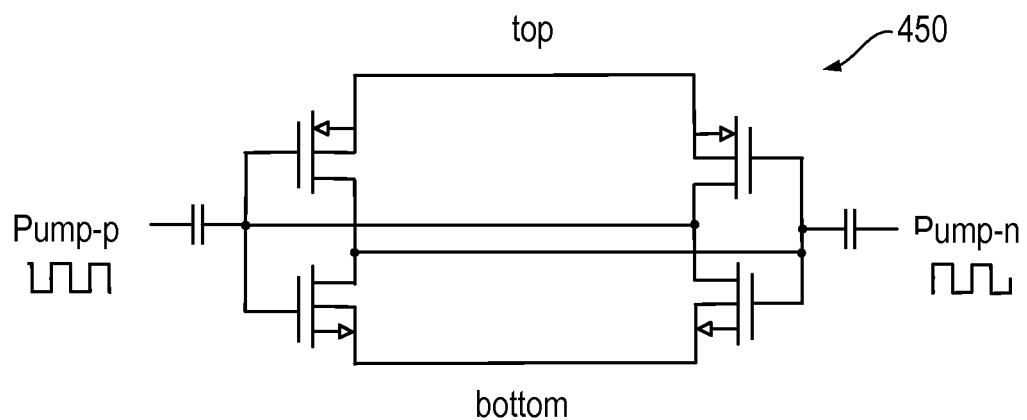
FIG. 4C illustrates additional detail of an embodiment of a charge pump stage.

FIG. 4B illustrates an example of one implementation for charge pump 411. The charge pump includes multiple stages 450 to pump up the voltage from the 2V to 16V using the clock signal $\phi$ 409 and its complement. Additional details of an embodiment of a charge pump stage is shown in FIG. 4C where the bottom of the stage receives the voltage from the previous stage and the top of the stage supplies the voltage to the next stage. Note that the charge pump details shown in FIGS. 4B and 4C are but one example and many different implementations may be utilized according to system needs and process capabilities.

Figure 4D:
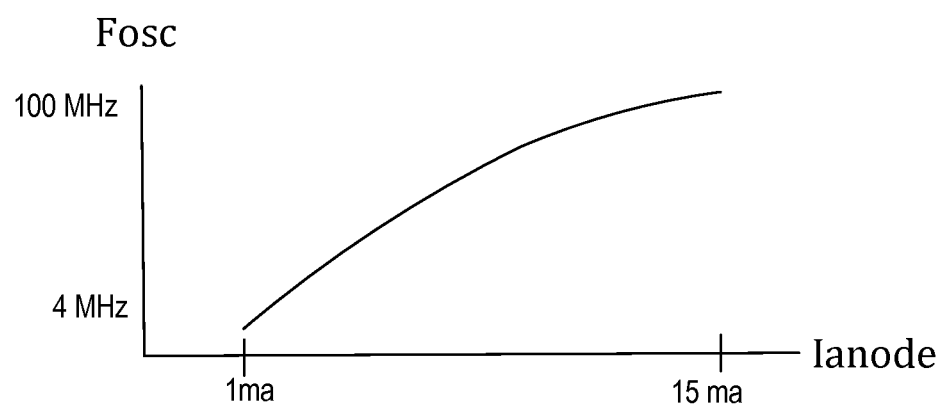
FIG. 4D illustrates the substantially linear relationship between anode current and output frequency in an embodiment.

In an embodiment, the frequency of the clock signal $\phi$ varies from 8 MHz at 1 mA input current to 200 MHz at 15 mA input current. The relationship between anode current and output frequency is substantially linear as shown in FIG. 4D. The pumped up voltage is supplied to a differential driver 419 that drives bond wires 421 with a signal having an amplitude equal to the charge pump high voltage and having a frequency ranging from 4 MHz to 100 MHz ($\phi$/2) depending on the current at the anode. The charge pump high voltage is ideally 16V in the illustrated embodiment but in operation may vary between 12V and 15V due to circuit non-idealities and the output impedance of the charge pump. The transmitted signal is received by the receive side with a voltage of approximately 3V due to the voltage division between the parasitic capacitors and the isolation capacitors. A receive side charge pump circuit 431 boosts the received signal to 10-12V, and generates a gate drive signal 433. The receive side charge pump may be implemented with fewer stages due to the reduced boost requirements (from 3V to 12V). Thus, energy from the switched isolation capacitors is converted into an output voltage capable of powering CMOS circuitry and charging the gate of a switching transistor such as transistor 235 (FIG. 2). The gate drive signal 433 turns on a transistor (not shown) responsive to the ON state and turns off the transistor responsive to the OFF state.

As discussed above, the amount of power transmitted across the isolation barrier is determined by the anode current because the frequency of the transmitted signal is determined by the anode current. That causes the capacitive isolation embodiment to work in a manner similar to opto-isolation implementations. In opto-isolation implementations, more current creates more light, which allows more power to be transferred. In the embodiment of FIG. 4A, more current results in a higher frequency, which allows more power to be delivered across the capacitive isolation barrier. Thus, the turn on time for the FET is linearly related to current at the anode. If the VCO reaches its maximum frequency, a clamp circuit 410 sinks any additional current once the VCO reaches its maximum frequency.

A clock stop detector circuit 435 detects when the transmissions across the isolation barrier stop. When the clocks are determined to have stopped, after a delay of e.g., 10-20 μs, the clock stop detector circuit 435 drives a signal 437 to transistor 438 to turn on the transistor to discharge the gate drive signal 433. That ensures that the gate voltage, which ramps slowly when the clocks start, goes low quickly, after a delay, in response to the transmit side stopping driving the clock signal across the isolation barrier. The detection of the clocks stopping corresponds to the current at anode 401 stopping. A weak pull down resistor 441, e.g., around 20 MOhms helps ensure the output gate drive voltage is zero volts when no clocks are running. When the clocks are running, the clock stop detector circuit keeps the signal 437 low to ensure the charge pump controls the gate drive signal 433. When the solid state relay 400 is in the off state (no input current), there is no power present on the receive die providing gate drive signal 433. Thus, the power for the charge pump 431, the clock stop detector 435 and FET 438 is derived from the clock signals transmitted across the isolation channel. Power stored in capacitors (not shown) supplies the clock stop detector when the clocks stop to ensure the gate drive signal may be discharged when clock stoppage is detected.

Figure 5:
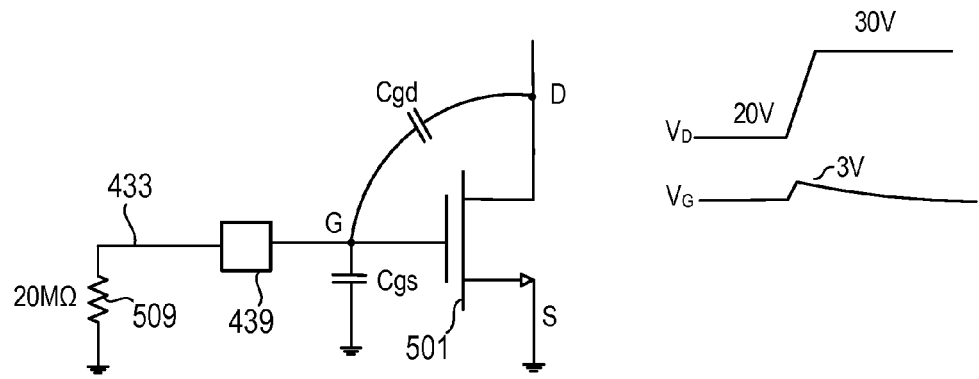
FIG. 5 illustrates why a voltage transient on the drain could lead to the FET turning on in response to the transient.
Figure 6:
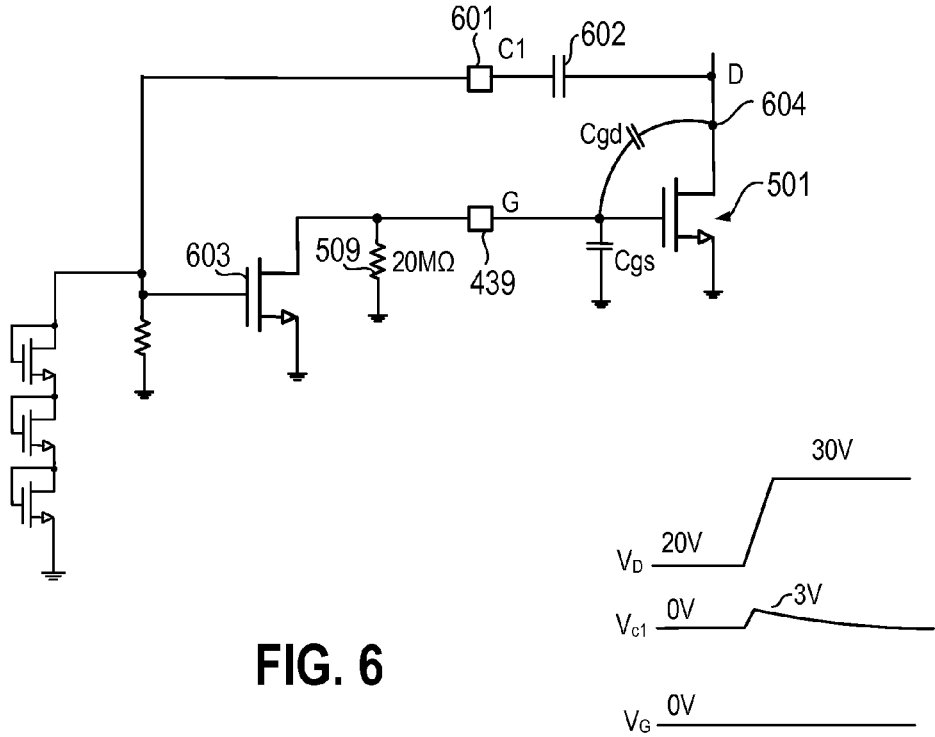
FIG. 6 illustrates a circuit to prevent the voltage transient from turning on the FET.

FIG. 5 illustrates the gate/drain capacitance (Cgd) and the gate source capacitance Cgs associated with an external FET 501 driven by the gate drive signal present on output terminal 439. Because there is no power present on the gate drive die when the SSR is in the off state and thus nothing to drive signal 433, and a high resistance 509 to ground, a sudden voltage transient on the drain, e.g., from 20V to 30 V can result in a small voltage, e.g., 3V on the gate, which may be enough to turn on the FET 501. Accordingly, as shown in FIG. 6, an embodiment addresses that risk by providing a clamp circuit including capacitor 602 and FET 603. An input terminal 601 is provided so an external capacitor 602 can be coupled between terminal 601 and the drain node 604 of FET 501. If a voltage transient $V_D$ occurs as shown in FIG. 6, a voltage $V_{C1}$ appears at input terminal 601, which is coupled to a gate terminal of FET 603. That voltage turns on FET 603 ensuring that the gate of FET 501 remains discharged and FET 501 does not turn on.

Figure 7:
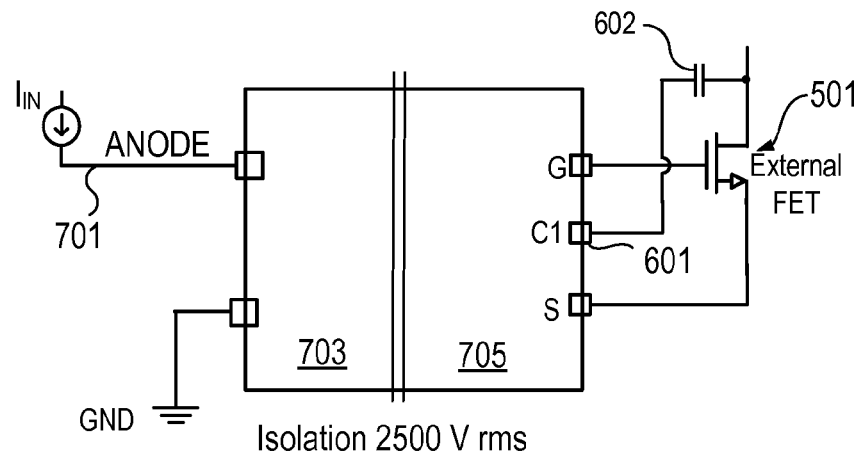
FIG. 7 illustrates another view of external connections for a clamp circuit to prevent the voltage transient from turning on the FET.

FIG. 7 illustrates external connections for the DC case shown in FIG. 6, wherein the input current 701 on the anode on the input die 703 controls the gate signal for one external FET 501 coupled to the output die 705. In such an embodiment, capacitor 602 is coupled between the drain node of FET 501 and the C1 input terminal. The C1 terminal is coupled to transistor 603 shown in FIG. 6.

Figure 8:
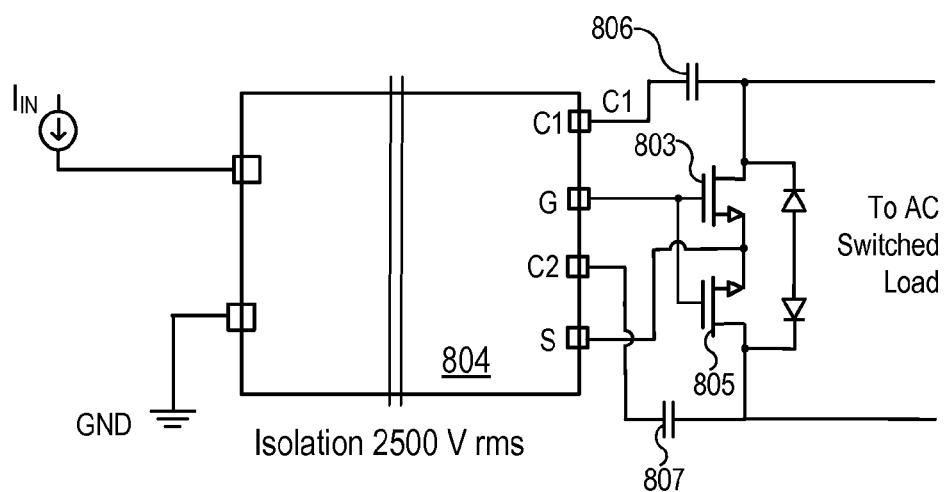
FIG. 8 illustrates another view of external connections for a clamp circuit to prevent voltage transients from turning on the FETs used for an AC switched load.

FIG. 8 illustrates an embodiment showing external connections to deal with voltage transients when an AC load is being driven. In such a case two external FETs 803 and 805 are driven by the output die 804. Two clamp circuits are used, one for each FET to ensure that sudden voltage transients on the drains of either FET do not result in turn on of the external FETs. Thus, two input pins C1 and C2 provide for the ability to couple the respective drains of the transistors 803 and 805 to the gates of internal FETs (configured in the manner of FET 603 in FIG. 6) through capacitors 806 and 807 to ensure the gate nodes of transistors 803 and 805 remain discharged if there is a voltage transient on either drain node of the external transistors.

Figure 9:
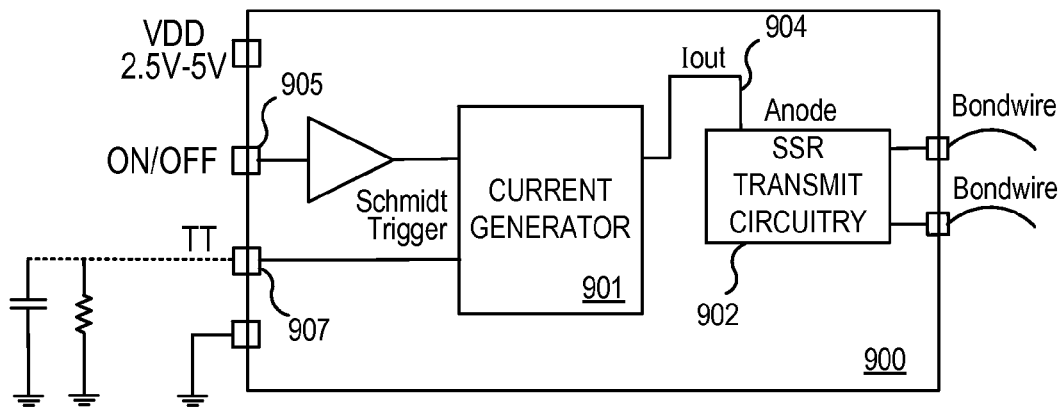
FIG. 9 illustrates an embodiment utilizing a standard CMOS input rather than a current as the control input on the transmit side.

While many applications utilize an input current to indicate the ON state and the OFF state and thus when to drive a FET on the other side of the isolation channel, other applications may prefer a standard CMOS input to control the solid state relay rather than a current. FIG. 9 illustrates such an embodiment. The transmit die 900 includes a current generator 901 and the solid state relay (SSR) transmit circuitry 902 shown, e.g., in FIG. 2A or as transmit die 401 in FIG. 4. The current generator 901 generates the anode current 904 utilized in the embodiments of FIGS. 2A and 4, based on the value of the input terminal 905. The transmit circuitry may receive a power supply voltage of, e.g., 2.5-5V. When the input on 905 is zero indicating the OFF state, no current is generated by current generator 901. When the input is a logical one indicating the ON state, then the current generator 901 generates the anode current. A Schmidt trigger may be used between the input terminal 905 and the current generator 901 to reduce the chances that noise on the input signal causes the current generator to unintentionally turn on or off.

Figure 10:
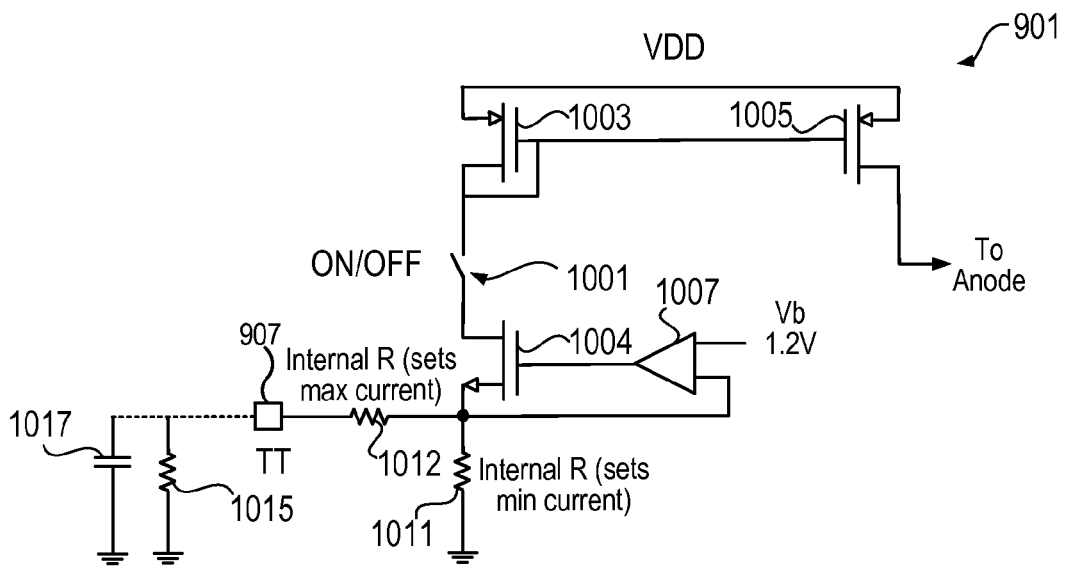
FIG. 10 illustrates an embodiment of a current generator utilized in FIG. 9.

While the current on/off control may be supplied on input terminal 905, input terminal 907 may be used to connect (or not connect) external components to control aspects of the current generated. FIG. 10 illustrates additional details of the current generator 901. The input terminal 905 controls the switch 1001. When the switch 1001 is closed, a current flows through transistors 1003 and 1004, which is mirrored through transistor 1005 and supplied as the anode current 904 to the SSR transmit circuitry 902. An operational amplifier 1007 receives a reference voltage Vb, e.g., at 1.2V and drives the gate of transistor 1004. A large internal resistance 1011 may be used to set the minimum current when the switch is closed. If the Turn-on Time (TT) terminal 907 is left floating, then the large internal resistance 1011 controls the anode current to be a minimum. A minimum current may be desired, e.g., for an application that can tolerate a slow turn on time for the external FET that is driven by the receive side die. If on the other hand a maximum current is desired to provide a faster turn on time, the TT terminal 907 may be grounded to provide, e.g., a maximum current of 10-15 mA into the anode and the internal resistor 1012 sets the maximum current. In addition, an external resistance 1015 may be used to set the generated current to whatever current is desired between the minimum current (TT floating) and the maximum current (TT grounded).

Figure 11:
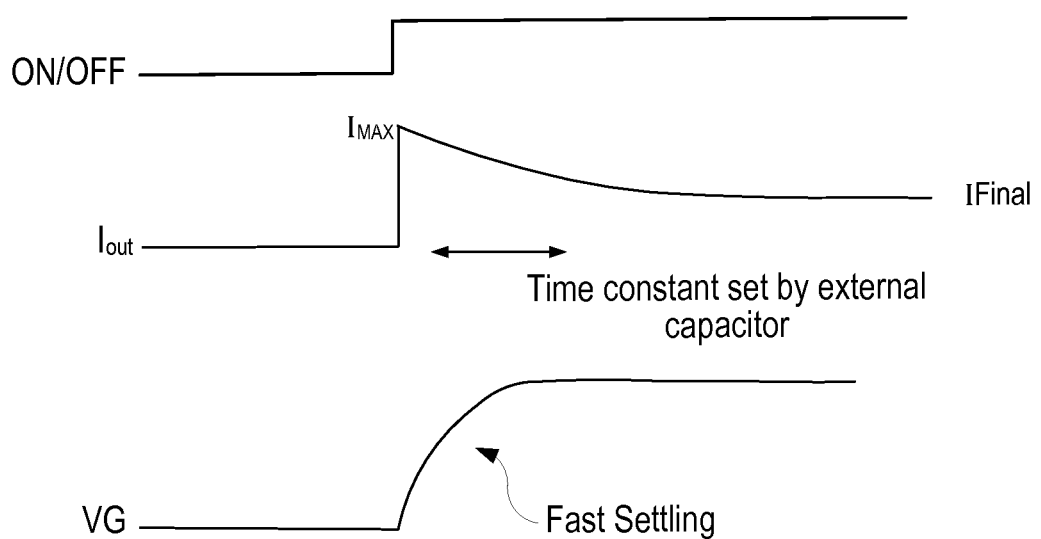
FIG. 11 illustrates waveform associated with use of an external capacitor to control the current generated by the current generator.

Another option is to utilize the capacitor 1017 coupled to the TT terminal 907. The capacitor acts like the TT terminal is shorted when the terminal 905 goes high and as the capacitor charges, the anode current is initially increased to a maximum current set by the internal resistor 1012. FIG. 11 illustrates the anode current Iout when a capacitor is coupled to the TT terminal 907. The time constant of the capacitor circuit determines how quickly the anode current settles to the final current as the capacitor charges. The final current may be determined by an external resistance also coupled to the TT terminal 907. Use of a capacitor provides the desirable feature of providing more power at turn on due to the higher anode current and thus higher frequency of the oscillator (see FIG. 4) to achieve fast turn of the external FET driven by the receive side. Thus, the gate voltage Vg supplied by the receive side to the external FET ramps quickly before it reaches a steady state voltage. After the initial turn on, the anode current decreases to Ifinal utilizing less power. Thus, a fast transient response is provided but average power is less than opto-based relays.

Thus, various aspects have been described relating to implementation of a solid state relay using a capacitive isolation channel. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   a first die including,
      an oscillator to supply a clock signal;
      a transmit side charge pump coupled to the clock signal to generate a transmit side boosted voltage;
      a driver circuit coupled to the clock signal and coupled to the transmit side charge pump to drive a transmit signal indicating an on state to a capacitive isolation communication channel, the transmit signal having a frequency based on the clock signal and a voltage based on the transmit side boosted voltage, the driver circuit driving no signal in response to an off state;
   a second die coupled to the first die through the capacitive isolation communication channel, the second die including,
      a second charge pump coupled to isolation capacitors of the capacitive isolation communication channel to boost a voltage based on a voltage of the transmit signal as received on a receive side of the capacitive isolation communication channel and supply a receive side boosted voltage, and to supply a gate voltage signal based on the receive side boosted voltage to a gate of a first transistor.

2. The apparatus as recited in claim 1 wherein the on state is determined by a received current and the off state is determined when no current is received.

3. The apparatus as recited in claim 2 wherein a frequency of the clock signal is determined in part according to the received current such that the frequency of the clock signal increases responsive to an increase in the received current.

4. The apparatus as recited in claim 1, further comprising:
   the first transistor coupled to the gate voltage signal.

5. The apparatus as recited in claim 4, further comprising:
   a second transistor coupled between a node having the gate voltage signal and ground, a gate of the second transistor coupled to an output terminal; and
   a capacitor coupled between a drain of the first transistor and the output terminal.

6. The apparatus as recited in claim 4, further comprising:
   a second transistor coupled between a node having the gate voltage signal and ground;
   a clock stop detector circuit responsive to the transmit received signal being stopped to supply a gate signal to turn on the second transistor to provide the node a discharge path to ground.

7. The apparatus as recited in claim 1, wherein the first die further comprises:
   a current generator circuit responsive to a first input terminal being at a first value indicative of the on state to generate a current and responsive to the first input terminal being at a second value indicative of the off state to supply no current.

8. The apparatus as recited in claim 7 wherein the first die further comprises:
   a second input terminal coupled to the current generator circuit, and wherein a value of the current is dependent upon zero or more circuits coupled to the second input terminal.

9. The apparatus as recited in claim 8 further comprising:
   a capacitor coupled to the second input terminal to cause the current to be initially at a first value that reduces to a second value according to a time constant associated with the capacitor, to thereby provide faster turn on of the first transistor as compared to if the second input terminal was floating, and to thereby provide an average current lower than the first value.

10. The apparatus as recited in claim 8 further comprising:
    a resistor coupled to the second input terminal, the current being determined according to a value of the resistor.

11. The apparatus as recited in claim 8 wherein the current is set at a minimum if the second input terminal is left floating.

12. A method comprising:
    receiving an indication of an on state and an off state to control a transistor across a capacitive isolation communication channel;
    supplying a clock signal from an oscillator;
    generating a first boosted voltage in a transmit side charge pump coupled to the clock signal;
    supplying a transmit signal to the capacitive isolation communication channel to indicate the on state, the transmit signal having a frequency based on the clock signal and a voltage based on the first boosted voltage;
    supplying no transmit signal responsive to the off state;
    receiving the transmit signal at a receive side of the capacitive isolation communication channel;
    boosting a voltage based on the received transmit signal in a receive side charge pump coupled to isolation capacitors of the capacitive isolation communication channel and supplying a second boosted voltage; and
    supplying a gate signal based on the second boosted voltage to a gate of the transistor to thereby control the transistor.

13. The method as recited in claim 12 further comprising receiving a current at an input terminal of a transmit die on which the oscillator is disposed to indicate the on state and receiving no current at the input terminal of the transmit die to indicate the off state.

14. The method as recited in claim 12 further comprising:
    supplying the gate signal from an output terminal of a receive die in which the receive side charge pump is disposed.

15. The method as recited in claim 14, further comprising:
    detecting transmission of the transmit signal being stopped responsive to the off state; and
    responsive to detecting the transmit signal being stopped, supplying a second gate signal to turn on a second transistor to pull the output terminal to ground.

16. The method as recited in claim 12 further comprising:
    increasing a frequency of the clock signal responsive to an increase in a current indicative of the on state such that a frequency of the clock signal increases responsive to an increase in the current; and
    decreasing the frequency of the clock signal responsive to a decrease in the current.

17. The method as recited in claim 12 further comprising:
generating a current in a current generator circuit responsive to a first input terminal of an integrated circuit in which the oscillator is disposed being at a first value to indicate the on state and supplying zero current responsive to the first input terminal being at a second value indicating the off state.

18. The method as recited in claim 17 further comprising:
determining characteristics of the current according to what circuit components, if any, are coupled to a second input terminal of the integrated circuit.

19. The method as recited in claim 18 further comprising:
setting a value of the current using a resistor coupled to the second input terminal.

20. The method as recited in claim 18 further comprising setting the current to a minimum value by leaving the second input terminal floating.

21. The method as recited in claim 18 further comprising:
using a capacitor coupled to the second input terminal to cause the current to be initially near a first value that reduces to a second value according to a time constant associated with the capacitor to thereby provide faster turn on of the transistor as compared to the second input terminal floating and to thereby provide an average current lower than the first value.

22. An apparatus comprising:
an oscillator to supply a clock signal having a frequency determined in part according to a current indicative of an on state, such that an increase in the current results in an increase in the frequency and a decrease in the current results in a decrease in the frequency;
a transmit side charge pump coupled to the clock signal to boost a voltage to generate a transmit side boosted voltage;
a driver circuit coupled to the clock signal and coupled to the charge pump to drive a transmit signal having a frequency based on the clock signal and a voltage based on the transmit side boosted voltage to an isolation communication path including isolation capacitors; and
a receive side charge pump coupled to the isolation capacitors to boost a voltage present in a received signal corresponding to the transmit signal and generate a receive side boosted voltage and to supply a gate signal based on the receive side boosted voltage to a gate of at least one transistor.

* * * * *